United States Patent
Kobayashi et al.

(10) Patent No.: US 8,043,979 B2
(45) Date of Patent: Oct. 25, 2011

(54) PLASMA OXIDIZING METHOD, STORAGE MEDIUM, AND PLASMA PROCESSING APPARATUS

(75) Inventors: Takashi Kobayashi, Amagasaki (JP); Junichi Kitagawa, Amagasaki (JP); Yoshiro Kabe, Amagasaki (JP); Toshihiko Shiozawa, Amagasaki (JP)

(73) Assignee: Tokyo Electron Limited, Tokyo (JP)

( * ) Notice: Subject to any disclaimer, the term of this patent is extended or adjusted under 35 U.S.C. 154(b) by 60 days.

(21) Appl. No.: 12/443,493

(22) PCT Filed: Sep. 27, 2007

(86) PCT No.: PCT/JP2007/068754
§ 371 (c)(1), (2), (4) Date: Mar. 30, 2009

(87) PCT Pub. No.: WO2008/041599
PCT Pub. Date: Apr. 10, 2008

(65) Prior Publication Data
US 2010/0105216 A1    Apr. 29, 2010

(30) Foreign Application Priority Data
Sep. 29, 2006  (JP) ................................ 2006-267741

(51) Int. Cl.
*H01L 21/31* (2006.01)
*H01L 21/469* (2006.01)

(52) U.S. Cl. ............ 438/772; 438/771; 257/E21.24; 257/E21.301

(58) Field of Classification Search ........... 438/772, 438/624, 771, 767, 305, 306, 532; 257/372, 257/327, E21.24, E21.301, E21.286, E21.285
See application file for complete search history.

(56) References Cited

U.S. PATENT DOCUMENTS

| | | | |
|---|---|---|---|
| 5,330,935 | A | 7/1994 | Dobuzinsky et al. |
| 5,412,246 | A | 5/1995 | Dobuzinsky et al. |
| 6,566,210 | B2 | 5/2003 | Ajmera et al. |
| 2003/0010972 | A1 | 1/2003 | Ajmera et al. |
| 2005/0233599 | A1 | 10/2005 | Sugawara et al. |
| 2006/0099799 | A1* | 5/2006 | Kohno et al. ............. 438/624 |
| 2008/0146041 | A1* | 6/2008 | Sasaki ..................... 438/772 |

FOREIGN PATENT DOCUMENTS

| | | |
|---|---|---|
| JP | 4 246161 | 9/1992 |
| JP | 2002-280369 | 9/2002 |
| JP | 2004 535077 | 11/2004 |
| WO | WO 02/058130 A1 | 7/2002 |

OTHER PUBLICATIONS

Office Action issued Dec. 6, 2010, in Korea Patent Application No. 10-2009-7006328.

* cited by examiner

*Primary Examiner* — Walter L Lindsay, Jr.
(74) *Attorney, Agent, or Firm* — Oblon, Spivak, McClelland, Maier & Neustadt, L.L.P.

(57) ABSTRACT

A plasma oxidizing method in which a plasma is produced in a processing chamber of a plasma processing apparatus under a processing condition that the proportion of oxygen in the processing gas is 20% or more and the processing pressure is 400 to 1333 Pa, and silicon exposed from the surface of an object to be processed is oxidized by the plasma to form a silicon oxide film.

5 Claims, 8 Drawing Sheets

PLASMA OXIDIZING METHOD, STORAGE MEDIUM, AND PLASMA PROCESSING APPARATUS

FIELD OF THE INVENTION

The present invention relates to a plasma oxidizing method, and more particularly to a plasma oxidizing method for forming, e.g., a silicon oxide film serving as an insulating film in a manufacturing process of various semiconductor devices.

BACKGROUND OF THE INVENTION

In a manufacturing process of various semiconductor devices, a silicon oxide film, such as $SiO_2$, is formed as an insulating film, e.g., a gate insulating film of a transistor. In order to form such a silicon oxide film, a thermal oxidation process using an oxidation furnace or a rapid thermal process (RTP) apparatus, and a plasma oxidation process using a plasma processing apparatus are employed. In a wet oxidation process using an oxidation furnace, which is one of the thermal oxidation processes, a silicon substrate is heated to 800° C. or more and exposed to an oxidizing atmosphere of water vapor ($H_2O$) by using a water vapor generator (WVG), which generates vapor ($H_2O$) through the combustion of oxygen and hydrogen, thereby oxidizing a surface of the silicon substrate to form a silicon oxide film.

On the other hand, in the plasma oxidation process, there is proposed a method, in which a silicon oxide film is formed by using a plasma processing apparatus introducing a microwave into a processing chamber through a radial line slot antenna to generate a plasma (see, e.g., Japanese Patent Laid-open Application No. 2001-160555).

The thermal oxidation process enables the formation of a silicon oxide film of good quality. On the contrary, the plasma oxidation process causes problems, which are not generated in the thermal oxidation process. Such problems may include variation in the film quality of the silicon oxide film, for example, deviation from the stoichiometric ratio in the amounts of Si and O in the silicon oxide film, and a large amount of defects in Si—O bonds due to Si dangling bonds in the film.

Further, in the plasma oxidation process, when a pattern having lines and spaces formed on the surface of an object to be processed includes sparse and dense portions having different pattern density, the silicon oxide film is formed at different rates at different portions, and it is difficult to form the silicon oxide film having a uniform thickness. If the thickness of silicon oxide film varies depending on the pattern density, it may deteriorate the reliability of a semiconductor device using the silicon oxide film as an insulating film.

SUMMARY OF THE INVENTION

It is an object of the present invention to provide a plasma oxidizing method capable of forming a silicon oxide film which has good film quality with few defects in Si—O bonds and further has a uniform thickness due to the low dependence of the film thickness on the density of prominences and depressions in a pattern, thereby allowing a semiconductor device to have excellent electrical characteristics.

In accordance with a first aspect of the present invention, there is provided a plasma oxidizing method comprising: loading an object to be processed, which has a silicon surface and a pattern of prominences and depressions, into a processing chamber of a plasma processing apparatus; forming a plasma in the processing chamber under a condition that a proportion of oxygen in a processing gas is 20% or more and a processing pressure ranges from 400 Pa to 1,333 Pa; and forming a silicon oxide film by oxidizing the silicon surface of the object by using the plasma.

In the first aspect, the processing pressure may range from 400 Pa to 667 Pa, and the proportion of oxygen in the processing gas may range from 20% to 100%. Further, the processing gas may include hydrogen in a proportion of 0.1% to 10%.

Further, a temperature of the object may range from 200° C. to 800° C. when the silicon oxide film is formed.

Further, the plasma may be a microwave-excited plasma formed by exciting the processing gas by a microwave introduced into the processing chamber by a planar antenna having plural slots.

Further, the pattern of the object may include sparse and dense portions having sparse and dense prominences and depressions.

In accordance with a second aspect of the present invention, there is provided a storage medium which is operated on a computer and stores a program for controlling a plasma processing apparatus including a processing chamber, wherein the program controls the plasma processing apparatus to perform a plasma oxidizing method including: loading an object to be processed, which has a silicon surface and a pattern of prominences and depressions, into a processing chamber of a plasma processing apparatus; forming a plasma in the processing chamber under a condition that a proportion of oxygen in a processing gas is 20% or more and a processing pressure ranges from 400 Pa to 1,333 Pa; and forming a silicon oxide film by oxidizing the silicon surface of the object by using the plasma.

In accordance with a third aspect of the present invention, there is provided a plasma processing apparatus comprising: a processing chamber in which an object to be processed is loaded; a processing gas supply unit for supplying a processing gas including oxygen into the processing chamber; a gas exhaust unit for evacuating the processing chamber to form a vacuum in the processing chamber; a plasma generating unit for generating a plasma of the processing gas in the processing chamber; and a controller configured to control the units to form the plasma in the processing chamber under a condition that a proportion of oxygen in the processing gas is 20% or more and a processing pressure is 400 Pa to 1,333 Pa, and to form a silicon oxide film by oxidizing a silicon surface of the object having an uneven pattern by using the plasma.

In accordance with the present invention, a silicon oxide film having excellent film quality can be formed. Therefore, when the silicon oxide film obtained by the method of the present invention is used as an insulating film of a semiconductor device, the semiconductor device can have good electrical characteristics.

Further, it is possible to form a silicon oxide film, which is not influenced by the density of prominences and depressions in a pattern formed on the surface of an object to be processed and has a uniform thickness, by the silicon oxide film forming method of the present invention. Therefore, when such a silicon oxide film is used as an insulating film of a semiconductor device, the reliability of the semiconductor device can be improved.

DETAILED DESCRIPTION OF THE EMBODIMENTS

Hereinafter, embodiments of the present invention will be described in detail with reference to the accompanying drawings.

Figure 1:
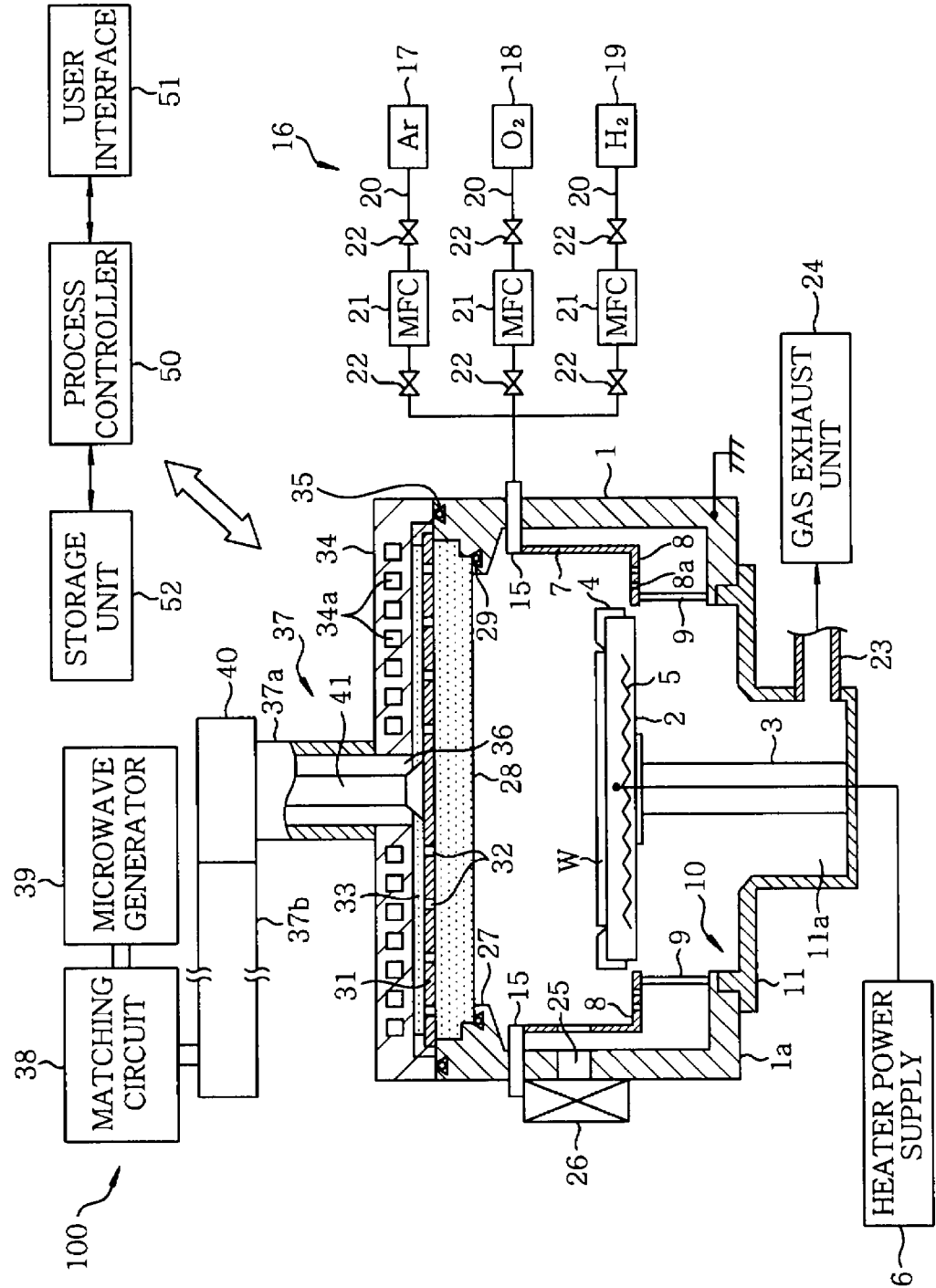
FIG. 1 is a cross sectional view schematically illustrating an example of a plasma processing apparatus for performing a silicon oxide film forming method in accordance with the present invention.

FIG. 1 is a cross sectional view schematically illustrating an example of a plasma processing apparatus for performing a silicon oxide film forming method in accordance with the present invention. The plasma processing apparatus is configured as a radial line slot antenna (RLSA) microwave plasma processing apparatus which introduces a microwave from a planar antenna with many slots, particularly a RLSA, into a processing chamber to generate a microwave plasma having a high density and a low electron temperature. The plasma processing apparatus may be suitably used to form insulating films of various semiconductor devices, for example, a gate insulating film of a transistor.

The plasma processing apparatus 100 includes an approximately cylindrical chamber 1, which is airtightly sealed and grounded. A circular opening 10 is formed at an approximately central portion of a bottom wall 1a of the chamber 1. A gas exhaust chamber 11, which is connected to the opening 10 and is protruded downwardly, is installed on the bottom wall 1a.

A susceptor 2 made of ceramic such as AlN is installed in the chamber 1 to horizontally support a substrate to be processed, i.e., a semiconductor wafer (hereinafter, referred to as a wafer) W. The susceptor 2 is supported by a cylindrical support member 3 which is made of ceramic such as AlN and is extended upwardly from a central bottom potion of the gas exhaust chamber 11. A guide ring 4 for guiding the wafer W is installed at an outer peripheral portion of the susceptor 2. Further, a resistance heater 5 is embedded in the susceptor 2. The resistance heater 5 is supplied with power from a heater power supply 6 to heat the susceptor 2, thereby heating the wafer W. In this case, a process temperature can be controlled within a range, for example, from a room temperature to 800° C. Further, a cylindrical liner 7 made of quartz is installed inside the chamber 1. A baffle plate 8, which is made of quartz and has a plurality of gas exhaust holes 8a, is installed in a ring shape at the outside of the susceptor 2 to uniformly evacuate the chamber 1. The baffle plate 8 is supported by several pillars 9.

Wafer supporting pins (not shown) are provided in the susceptor 2 to be protruded from the surface of the susceptor 2 and retracted into the susceptor 2, thereby supporting and moving the wafer W up and down.

A gas inlet member 15 having a ring shape is provided at a sidewall of the chamber 1, and gas inlet holes are uniformly formed through the gas inlet member 15. A gas supply system 16 is connected to the gas inlet member 15. The gas inlet member 15 may have a showerhead shape. For example, the gas supply system 16 includes an Ar gas supply source 17, an $O_2$ gas supply source 18 and a $H_2$ gas supply source 19. Ar, $O_2$ and $H_2$ gases reach the gas inlet member 15 via respective gas lines 20 and are uniformly introduced into the chamber 1 through the gas inlet holes of the gas inlet member 15. Each of the gas lines 20 is provided with a mass flow controller 21 and valves 22 located at the upstream and downstream sides of the mass flow controller 21. The Ar gas may be replaced by another rare gas, e.g., Kr gas, He gas, Ne gas, Xe gas or the like, and the rare gas may be omitted, as will be described later.

A gas exhaust pipe 23 is connected to the side surface of the gas exhaust chamber 11, and a gas exhaust unit 24 including a high speed vacuum pump is connected to the gas exhaust pipe 23. As the gas exhaust unit 24 is operated, the gas in the chamber 1 uniformly moves to a space 11a of the gas exhaust chamber 11 and is discharged through the gas exhaust pipe 23. Accordingly, the inner pressure of the chamber 1 may be rapidly lowered down to a predetermined vacuum level of, e.g., 0.133 Pa.

At the sidewall of the chamber 1, there are provided a loading/unloading port 25 through which the wafer W is delivered between the chamber 1 and a transfer chamber (not shown) adjacent to the plasma processing apparatus 100, and a gate valve 26 for opening and closing the loading/unloading port 25.

An opening is formed at an upper portion of the chamber 1, and a support part 27 having a ring shape is installed along the circumference of the opening. A microwave transmitting plate 28, which is made of a dielectric, for example, ceramic such as quartz or $Al_2O_3$ and transmits a microwave, is airtightly installed at the support part 27 through a seal member 29. Therefore, the inside of the chamber 1 can be maintained in a hermetically sealed state.

A planar antenna plate 31 having a circular plate shape is installed above the microwave transmitting plate 28 to face the susceptor 2. The planar antenna plate 31 is suspended on the upper end of the sidewall of the chamber 1. When the wafer W has a size of, e.g., 8 inches, the planar antenna plate 31 is configured as a circular plate, which has a diameter of 300 to 400 mm and a thickness of 1 to several mm (for example, 1 mm) and is made of a conductive material. Specifically, the planar antenna plate 31 is formed of a silver or gold plated steel plate or an aluminum plate, and a plurality of microwave radiation holes (slots) are formed in a specific pattern through the planar antenna plate 31. The planar antenna plate 31 may be formed of a nickel plate or a stainless steel plate.

Figure 2:
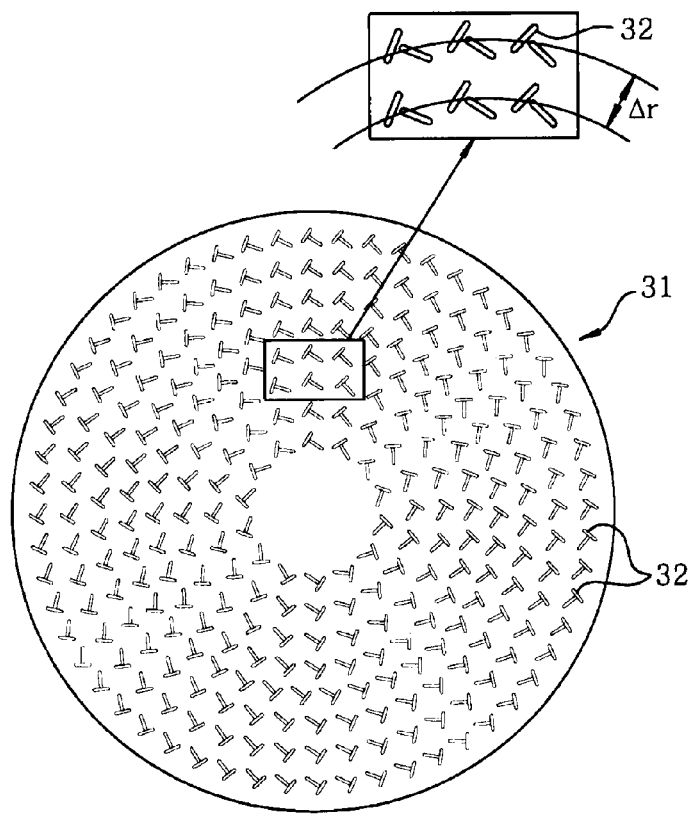
FIG. 2 illustrates a structure of a planar antenna plate.

As shown in FIG. 2, the microwave radiation holes 32 have pairs of long slots, wherein each pair of the microwave radiation holes 32 are generally arranged in a "T" shape. The pairs of the microwave radiation holes 32 are arranged in plural concentric circles. The length and arrangement interval of the microwave radiation holes 32 depend on the wavelength (λg) of the microwave. For example, the microwave radiation holes 32 may be arranged at intervals of λg/4, λg/2 or λg. In FIG. 2, an interval between adjacent microwave radiation holes 32 on different concentric circles is represented by Δr. Also, the microwave radiation holes 32 may have a circular shape, a circular arc shape or the like. No particular limitation is imposed on the arrangement of the microwave radiation holes 32. For example, the microwave radiation holes 32 may be arranged in a spiral or radial pattern in addition to the concentric circular pattern.

A wave retardation member 33, which is made of a dielectric material having a larger dielectric constant than that of a vacuum, for example, quartz, is installed on the upper surface of the planar antenna plate 31. The wave retardation member 33 may be made of resin, such as polytetrafluorethylene or polyimide. Since the microwave has a longer wavelength in a vacuum, the wave retardation member 33 functions to shorten the wavelength of the microwave to control the plasma. Further, the planar antenna member 31 may be in contact with or separated from the transmitting plate 28 and the wave retardation member 33.

A shield cover 34, which is made of metal such as aluminum, stainless steel or copper, is installed on the upper surface of the chamber 1 to cover the planar antenna plate 31 and the wave retardation member 33. The shield cover 34 serves as a portion of a waveguide, and uniformly transmits a microwave in a radial shape. The upper surface of the chamber 1 and the shield cover 34 are sealed with a seal member 35. Cooling water paths 34a are formed in the shield cover 34, and cooling water flows through the cooling water paths 34a to cool the shield cover 34, the wave retardation member 33, the planar antenna plate 31 and the microwave transmitting plate 28. Further, the shield cover 34 is grounded.

An opening 36 is formed at the center of an upper wall of the shield cover 34, and a waveguide 37 is connected to the opening 36. A microwave generator 39 is connected to the end of the waveguide 37 via a matching circuit 38. Accordingly, a microwave generated from the microwave generator 39 and having a frequency of, e.g., 2.45 GHz is propagated to the planar antenna plate 31 via the waveguide 37. Further, the microwave may have a frequency of 8.35 GHz, 1.98 GHz, or the like.

The waveguide 37 includes a coaxial waveguide 37a having a circular cross sectional shape, which is extended upwardly from the opening 36 of the shield cover 34, and a rectangular waveguide 37b, which is connected to the upper end of the coaxial waveguide 37a via a mode converter 40 and is extended in the horizontal direction. The mode converter provided between the coaxial waveguide 37a and the rectangular waveguide 37b functions to convert a microwave propagating in a TE mode through the rectangular waveguide 37b into a TEM mode microwave. An internal conductor 41 is provided at the center of the coaxial waveguide 37a, and a lower end of the internal conductor 41 is fixed to the center of the planar antenna plate 31. Accordingly, the microwave is uniformly and efficiently propagated to the planar antenna plate 31 via the internal conductor 41 of the coaxial waveguide 37a.

Each component of the plasma processing apparatus 100 is connected to and controlled by a process controller 50 having a CPU. A user interface 51, including a keyboard for inputting commands or a display for displaying an operation status of the plasma processing apparatus 100, is connected to the process controller 50 to allow a process manager to manage the plasma processing apparatus 100.

Further, the process controller 50 is connected to a storage unit 52 which stores recipes including control programs (software) for implementing various processes in the plasma processing apparatus 100 under control of the process controller 50, process condition data and the like.

If necessary, as a certain recipe is retrieved from the storage unit 52 in accordance with an instruction inputted through the user interface 51 and transmitted to the process controller 50, a desired process is performed in the plasma processing apparatus 100 under control of the process controller 50. Further, the recipes including control programs, process condition data and the like can be stored in and retrieved from a computer-readable storage medium such as a CD-ROM, a hard disk, a flexible disk and a flash memory, or retrieved through an on-line connected via, for example, a dedicated line to another apparatus available all the time.

The plasma processing apparatus 100 having the above configuration can provide a film having good quality by performing a damage-free plasma process even at a low temperature of 800° C. or less, and preferably 500° C. or less while achieving both excellent plasma uniformity and process uniformity.

The plasma processing apparatus 100 may be applied to a case in which a silicon oxide film is formed as a gate insulating film of a transistor as described above, and a case in which an oxide film is formed in a trench in a shallow trench isolation (STI) process for device isolation in a manufacturing process of a semiconductor device.

Hereinafter, a trench oxidation process using the plasma processing apparatus 100 will be described. First, the gate valve 26 is opened, and a wafer W having a trench is loaded into the chamber 1 through the loading/unloading port 25 to be mounted on the susceptor 2.

Thereafter, an Ar gas and an $O_2$ gas are supplied into the chamber 1 from the Ar gas supply source 17 and the $O_2$ gas supply source 18 of the gas supply system 16 at predetermined flow rates via the gas inlet member 15, and the chamber 1 is maintained at a specific processing pressure. In this case, a proportion of oxygen in the processing gas needs to be 20% or more, e.g., 25 to 100%, more preferably 50 to 100%, and desirably 75 to 100%. The amount of oxygen ions or oxygen radicals in the plasma can be controlled by adjusting the proportion of oxygen in the processing gas, as described above. Thus, even when the silicon surface of the wafer W has a pattern of, for example, prominences and depressions or grooves, the amount of oxygen ions or oxygen radicals reaching depressions is controlled by adjusting the partial pressure of an oxygen gas, thereby forming a silicon oxide film having a uniform thickness.

The gas flow rates of the processing gas may be selected within a range of Ar gas of 0 to 3,000 mL/min and a range of $O_2$ gas of 10 to 500 mL/min, such that the proportion of oxygen to a total flow rate of the processing gas meets the above condition.

Further, in addition to Ar gas and $O_2$ gas from the Ar gas supply source 17 and the $O_2$ gas supply source 18, $H_2$ gas from the $H_2$ gas supply source 19 may be introduced into the chamber 1 at a predetermined proportion. An oxidation rate in the plasma oxidation process can be improved by supplying $H_2$ gas. When $H_2$ gas is supplied, OH radicals are generated and contribute to the improvement of the oxidation rate. In this case, the proportion of $H_2$ gas in the total amount of the processing gas needs to be 0.1 to 10%, more preferably 0.1 to 5%, and desirably 0.1 to 2%.

A processing pressure in the chamber 1 is 400 Pa or more, for example, preferably 400 Pa to 1,333 Pa, more preferably 400 Pa to 667 Pa.

Further, a process temperature may be selected within a range of 200 to 800° C., preferably 400 to 500° C.

Thereafter, the microwave from the microwave generator 39 is guided to the waveguide 37 via the matching circuit 38. The microwave sequentially passes through the rectangular waveguide 37b, the mode converter 40 and the coaxial waveguide 37a and is supplied to the planar antenna plate 31. Then, the microwave is radiated from the planar antenna plate 31 to a space above the wafer W in the chamber 1 through the microwave transmitting plate 28. The microwave is propagated in the TE mode within the rectangular waveguide 37b, and the TE mode microwave is converted into a TEM mode microwave in the mode converter 40. The TEM mode microwave is propagated within the coaxial waveguide 37a toward the planar antenna plate 31. Preferably, the microwave generator 39 is set at a power density of 0.41 to 4.19 W/cm$^2$ and at a power level of 0.5 to 5 kW.

An electromagnetic field is formed in the chamber 1 by the microwave radiated from the planar antenna plate 31 into the chamber 1 via the microwave transmitting plate 28, thereby converting Ar gas, O$_2$ gas and the like into a plasma. The silicon surface exposed in the depressions of the wafer W is oxidized by the plasma. This microwave plasma is a high-density plasma having a density of approximately $1 \times 10^{10}$ to $5 \times 10^{12}$/cm$^3$ or more, which is obtained by radiating the microwave through the plural microwave radiation holes 32 of the planar antenna plate 31, and has an electron temperature of about 0.5 to 2 eV and plasma density uniformity of ±5% or less. Therefore, the oxidation process is performed at a low temperature for a short period of time, thereby forming a thin and uniform oxide film. Further, the oxide film suffers little damage due to the plasma, and a silicon oxide film of good quality can be formed.

As the plasma oxidation process is performed under the conditions in which the processing pressure is 400 Pa to 1,333 Pa and the proportion of oxygen in the total amount of the processing gas is 20% or more, it is possible to form a silicon oxide film, which is not affected by the density of prominences and depressions in a pattern formed on the surface of an object to be processed and has excellent film quality. Accordingly, the silicon oxide film obtained through this method provides excellent electrical characteristics to a semiconductor device using the silicon oxide film as an insulating film.

Next, test results showing the effects of the present invention will be described.

Figure 3:
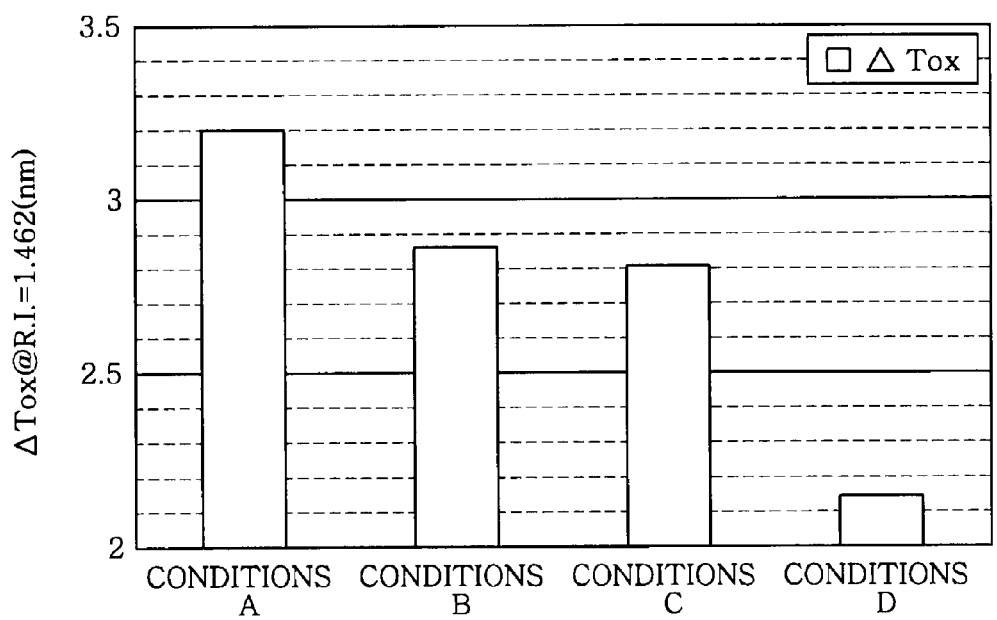
FIG. 3 is a graph illustrating results of the comparison of etching rates by wet etching.

FIG. 3 shows measurement results of decrements $\Delta T_{ox}$ of the film thickness of silicon oxide films, obtained when the silicon oxide films having a film thickness of 6 nm were respectively formed on silicon surfaces under the following conditions A to D, and were soaked in dilute hydrofluoric acid (HF:H$_2$O=1:100) for 10 seconds to be wet-etched. In this case, the conditions A and B represent comparison methods, and the conditions C represent the method of the present invention. Further, the conditions D represent a thermal oxidation method (for reference).

<Conditions A> . . . low oxygen and low pressure plasma oxidation process
 Ar flow rate: 500 mL/min(sccm)
 O$_2$ flow rate: 5 mL/min(sccm)
 H$_2$ flow rate: 0 mL/min(sccm)
 O$_2$ gas proportion: approximately 1%
 Processing pressure: 133.3 Pa (1 Torr)
 Microwave power: 2,750 W
 Microwave power density: 2.3 W/cm$^2$
 Process temperature: 400° C.
 Process time: 360 seconds <Conditions B> . . . low oxygen, low pressure and H$_2$ addition plasma oxidation process
 Ar flow rate: 500 mL/min(sccm)
 O$_2$ flow rate: 5 mL/min(sccm)
 H$_2$ flow rate: 5 mL/min(sccm)
 O$_2$ gas proportion: approximately 1%
 Processing pressure: 133.3 Pa (1 Torr)
 Microwave power: 2,750 W
 Microwave power density: 2.3 W/cm$^2$
 Process temperature: 400° C.
 Process time: 55 seconds <Conditions C> . . . high oxygen, high pressure and H$_2$ addition plasma oxidation process
 Ar flow rate: 120 mL/min(sccm)
 O$_2$ flow rate: 37 mL/min(sccm)
 H$_2$ flow rate: 3 mL/min(sccm)
 O$_2$ gas proportion: approximately 23%
 Processing pressure: 666.5 Pa (5 Torr)
 Microwave power: 2,750 W
 Microwave power density: 2.3 W/cm$^2$
 Process temperature: 400° C.
 Process time: 444 seconds <Conditions D> . . . WVG thermal oxidation process
 Process temperature: 950° C.

As seen from FIG. 3, the silicon oxide film, formed by the method of the present invention under the conditions C of high oxygen, high pressure and H$_2$ addition, had a smaller etched amount by in dilute hydrofluoric acid compared to the silicon oxide film formed by the comparison methods under the conditions A of low oxygen and low pressure or the conditions B of low oxygen, low pressure and H$_2$ addition, and had a high density and good film quality next to the silicon oxide film formed by the thermal oxidation process under the conditions D.

Figure 4A:
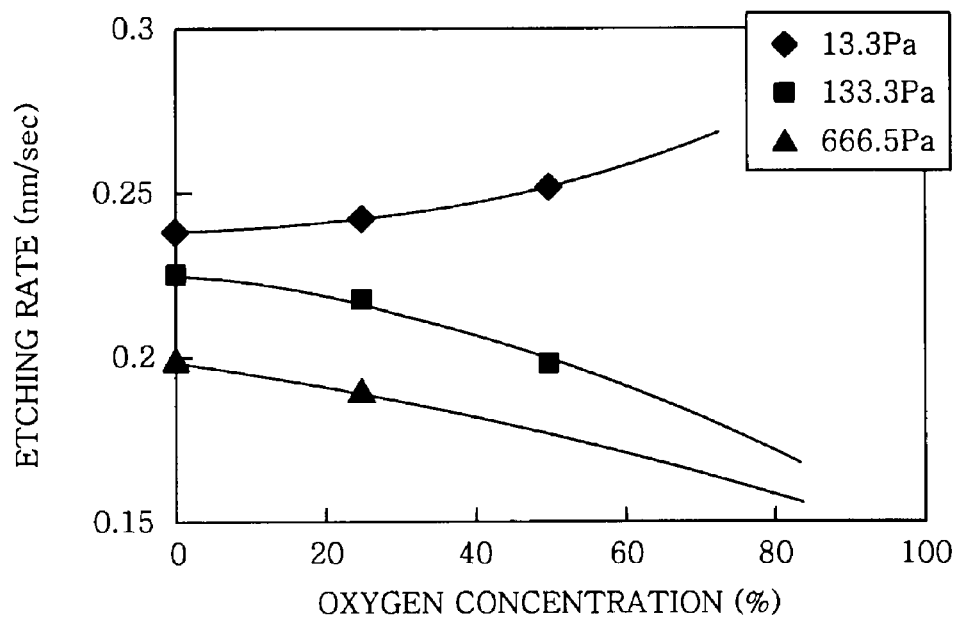
FIG. 4A is a graph illustrating a relationship between an oxygen concentration and an etching rate of a silicon oxide film in a plasma oxidation process.
Figure 4B:
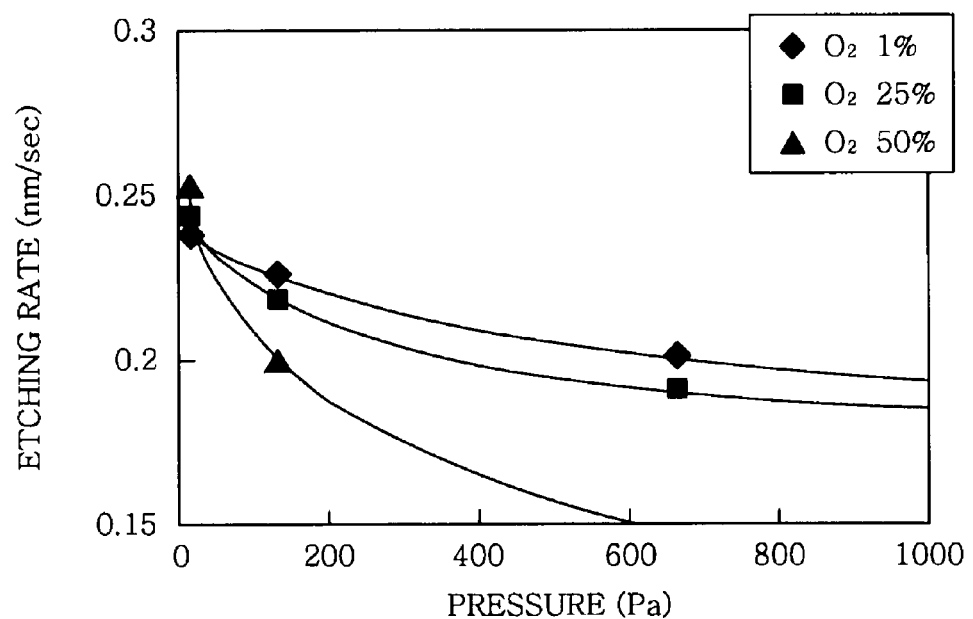
FIG. 4B is a graph illustrating a relationship between a pressure and the etching rate of the silicon oxide film in the plasma oxidation process.

The plasma oxidation process was carried out on the silicon surface by varying the O$_2$ gas proportion and the processing pressure under the following conditions, and a silicon oxide film having a film thickness of 8 nm was formed. Thereafter, the silicon oxide film was soaked in dilute hydrofluoric acid (HF:H$_2$O=1:100) for 10 seconds to be wet-etched, and the decrement $\Delta T_{ox}$ (etching rate) of the film thickness of silicon oxide film due to the wet-etching was measured. Table 1 shows the obtained results. FIG. 4A illustrates a relationship between the O$_2$ gas proportion (oxygen concentration) and the etching rate converted into the decrement $\Delta T_{ox}$, and FIG. 4B illustrates a relationship between the processing pressure and the etching rate converted into the decrement $\Delta T_{ox}$.

<Conditions E>
 Ar flow rate: 990, 750, or 500 mL/min(sccm)
 O$_2$ flow rate: 10, 250, or 500 mL/min(sccm)
 H$_2$ flow rate: 0 mL/min(sccm)
 O$_2$ gas proportion: approximately 1%, approximately 25%, or approximately 50%
 Processing pressure: 13.3 Pa (0.1 Torr), 133.3 Pa (1 Torr), or 666.5 Pa (5 Torr)
 Microwave power: 4,000 W
 Microwave power density: 3.35 W/cm$^2$
 Process temperature: 800° C.
 Process time: 30 to 500 seconds

TABLE 1

| | Etching rate (nm) | | |
|---|---|---|---|
| Pressure (Pa) | Oxygen 1% | Oxygen 25% | Oxygen 50% |
| 13.3 | 2.38 | 2.43 | 2.52 |
| 133.3 | 2.25 | 2.18 | 2.00 |
| 666.5 | 2.01 | 1.91 | — |

From Table 1 and FIGS. 4A and 4B, it was confirmed that the silicon oxide films formed at high oxygen concentrations (25% and 50%) and a high pressure (666.5 Pa) had small etching rates of and high densities.

Figure 5A:
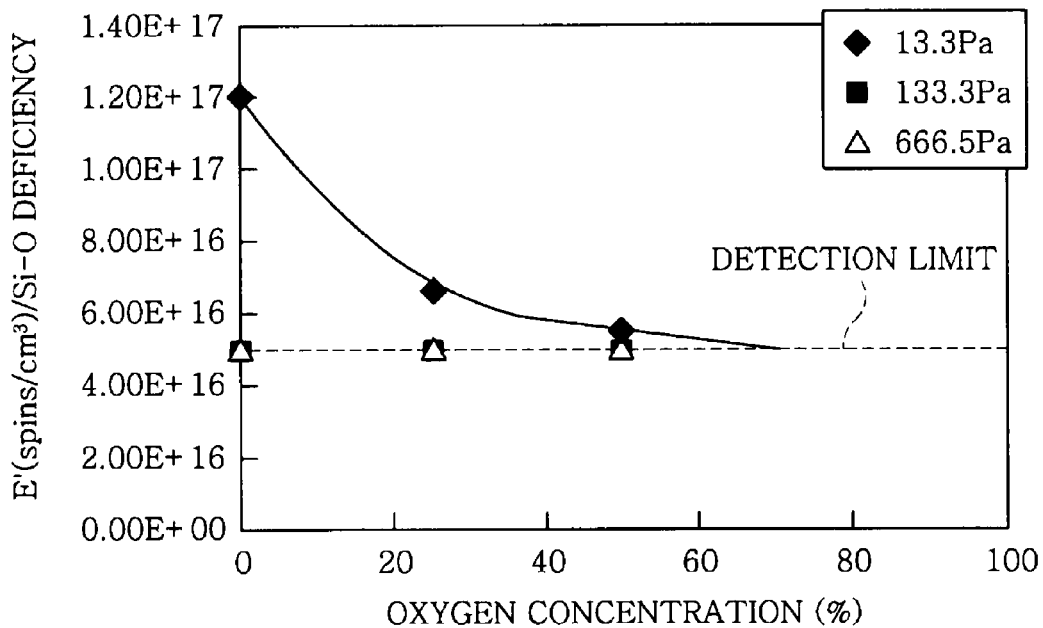
FIG. 5A is a graph illustrating a relationship between an oxygen concentration and a deficiency amount E' obtained by an ESR analysis of the silicon oxide film in the plasma oxidation process.

Further, a deficiency amount E' of Si—O bonds in the silicon oxide film formed by the plasma oxidation process under the above conditions E was measured by an electron spin resonance (ESR) analyzer. Table 2 shows the obtained results. FIG. 5A illustrates a relationship between the $O_2$ gas proportion (oxygen concentration) and the deficiency amount E' obtained by an ESR analysis of the silicon oxide film, and FIG. 5B illustrates a relationship between the processing pressure and the deficiency amount E' obtained by the ESR analysis of the silicon oxide film.

TABLE 2

| | Si—O deficiency amount E' (spins/cm$^3$) | | |
|---|---|---|---|
| Pressure (Pa) | Oxygen 1% | Oxygen 25% | Oxygen 50% |
| 13.3 | $1.2 \times 10^{17}$ | $6.7 \times 10^{16}$ | $5.6 \times 10^{16}$ |
| 133.3 | Less than detection limit | Less than detection limit | Less than detection limit |
| 666.5 | Less than detection limit | Less than detection limit | Less than detection limit |

Figure 5B:
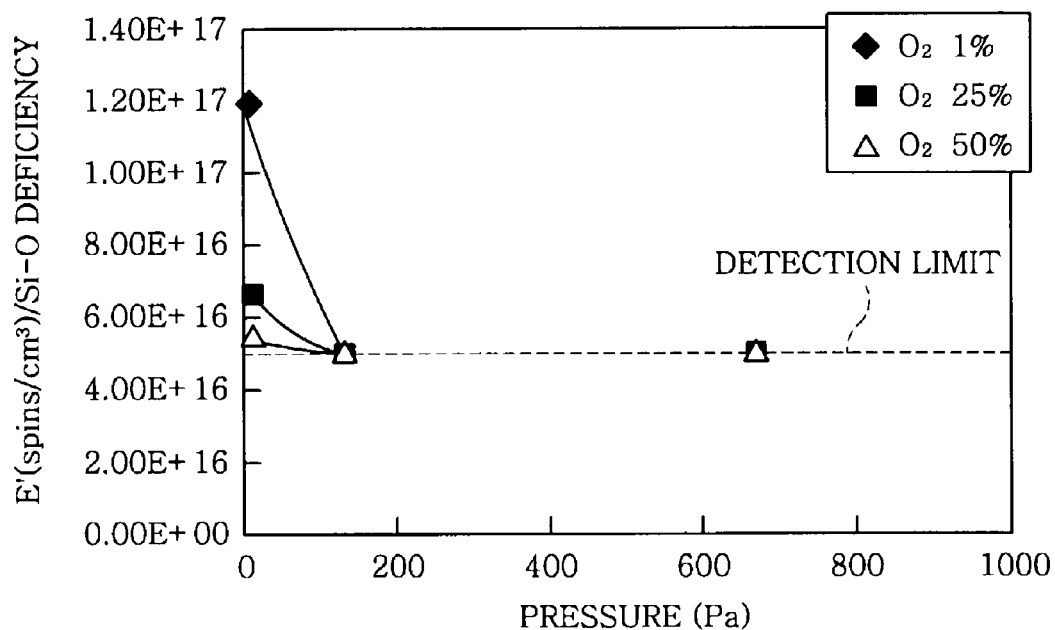
FIG. 5B is a graph illustrating a relationship between a pressure and the deficiency amount E' obtained by the ESR analysis of the silicon oxide film in the plasma oxidation process.

From Table 2 and FIGS. 5A and 5B, it was confirmed that the deficiency amounts E' of Si—O bonds in the silicon oxide films formed at a high processing pressure (666.5 Pa) were less than a detection limit of about $5 \times 10^{16}$ spins/cm$^3$ and these silicon oxide films had few defects and good film quality.

Figure 6:
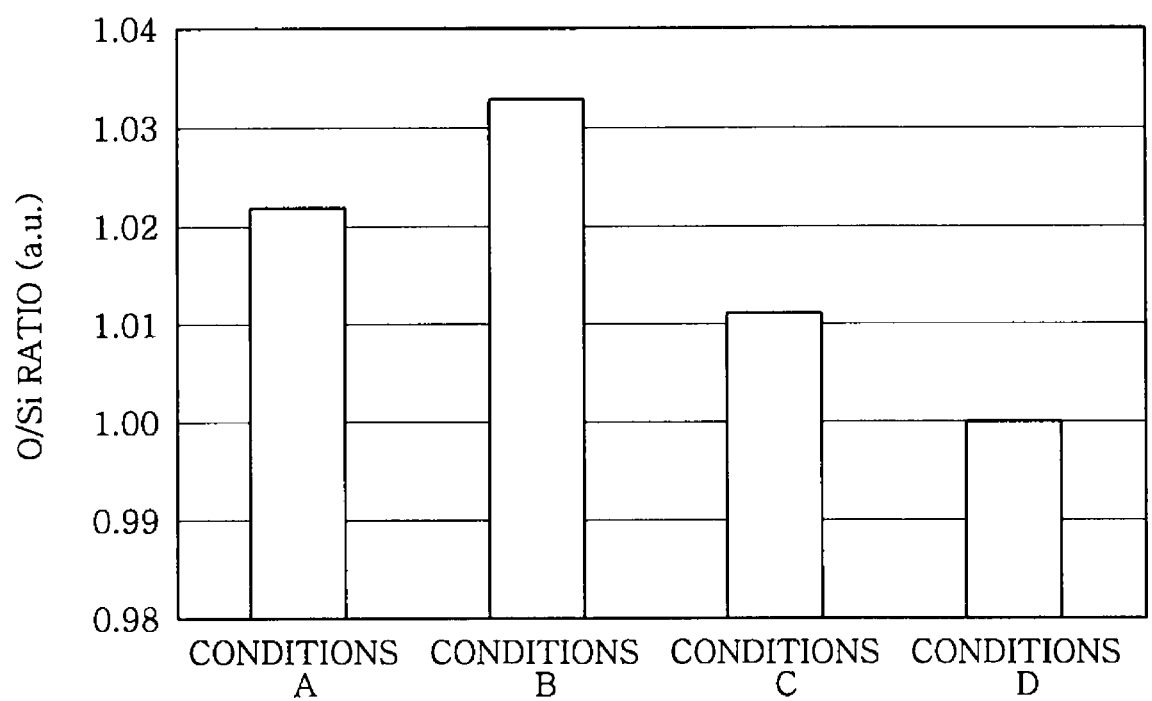
FIG. 6 is a graph illustrating results of the comparison of an O/Si ratio in a film by an XPS analysis.

FIG. 6 illustrates results of the measurement of oxygen/silicon (O/Si) ratios in the silicon oxide films formed by the oxidation process under the above conditions A to D, which were obtained by using an X-ray photoelectron spectroscopy (XPS) analyzer. A vertical axis of FIG. 6 represents normalized values on the basis of the O/Si ratio of the silicon oxide film formed by the WVG thermal oxidation process under the conditions D.

From FIG. 6, it could be seen that the silicon oxide film formed by the method of the present invention under the conditions C of high oxygen, high pressure, and $H_2$ addition had an O/Si ratio close to that of the silicon oxide film formed by the thermal oxidation process under the conditions D and had good film quality compared to the silicon oxide film formed by the comparison methods under the conditions A of low oxygen and low pressure or the conditions B of low oxygen, low pressure, and $H_2$ addition. Also, when $H_2$ gas is not added into the processing gas, the same results were obtained.

Figure 7:
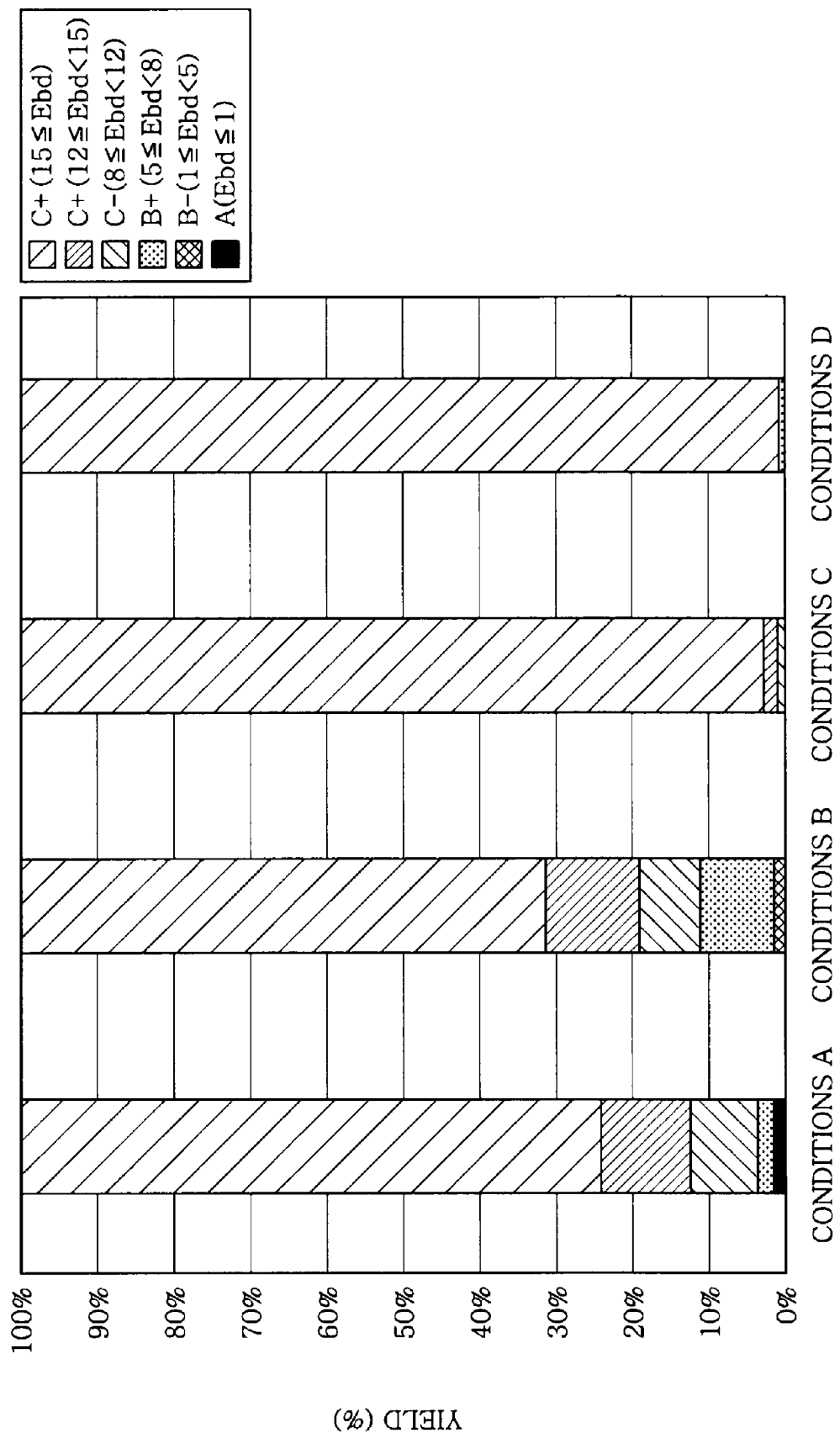
FIG. 7 is a graph illustrating results of a TZDB test.

FIG. 7 illustrates results of a dielectric reliability evaluation test (time zero dielectric breakdown (TZDB) test) carried out to evaluate the reliability of the silicon oxide films formed by the oxidation processes under the above conditions A to D. The silicon oxide films subjected to the TZDB test had a film thickness $T_{ox}$ of 6 nm, an area S of 5 mm$^2$, and measurement places N of 112 points.

From FIG. 7, it could be seen that the silicon oxide film formed by the method of the present invention under the conditions C of high oxygen, high pressure, and $H_2$ addition had a high yield (satisfactory standard C+(15≦Ebd)), which is much higher than that of the silicon oxide film formed by the comparison method under the conditions A of low oxygen and low pressure or the conditions B of low oxygen, low pressure, and $H_2$ addition, and is close to that of the silicon oxide film formed by the thermal oxidation process under the conditions D. Through these results, it was confirmed that the silicon oxide film formed under the conditions C of high oxygen, high pressure, and $H_2$ addition had an excellent dielectric breakdown resistance. Also, when $H_2$ gas is not added to the processing gas, the same results were obtained.

Figure 8:
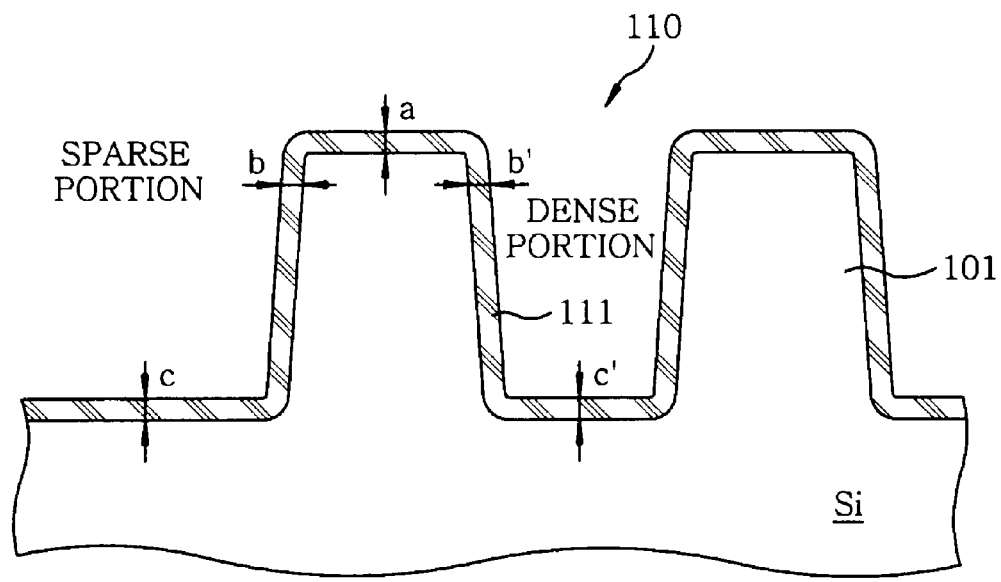
FIG. 8 is a longitudinal cross sectional view illustrating the surface of a wafer having a pattern with dense and sparse portions.

Next, an application example of the silicon oxide film forming method of the present invention to the formation of an oxide film on a silicon surface with a pattern having dense and sparse portions will be described. FIG. 8 shows a longitudinal cross sectional structure of an essential portion of the wafer W after an oxide film 111 is formed on the surface of a silicon substrate 101 with a pattern 110 by the plasma oxidation process under the above conditions A to C.

In this test, the plasma oxidation process was performed under the above conditions A to C. After silicon oxide films were formed under the respective conditions, top thicknesses a, side thicknesses b, and bottom thicknesses c of sparse portions of the silicon oxide films and top thicknesses a', side thicknesses b', and bottom thicknesses c' of dense portions of the silicon oxide films were respectively measured. Table 3 shows the obtained results.

TABLE 3

| | Conditions A | | Conditions B | | Conditions C | |
|---|---|---|---|---|---|---|
| | Sparse portion | Dense portion | Sparse portion | Dense portion | Sparse portion | Dense portion |
| Top thickness (nm) | 6.1 | — | 6.2 | — | 7.3 | — |
| Side thickness (nm) | 6.4 | 5.5 | 5.9 | 4.3 | 7.3 | 8.0 |
| Side density ratio (%) | 85.9 | | 72.9 | | 109.6 | |
| Bottom thickness (nm) | 5.7 | 3.9 | 5.3 | 3.2 | 6.8 | 6.3 |
| Bottom density ratio (%) | 68.4 | | 60.4 | | 92.6 | |

A density ratio in Table 3 represents a ratio of a film thickness of a dense portion to a film thickness of a sparse portion. As the density ratio is close to 100%, a film thickness difference due to the pattern density is small. As shown in Table 3, the silicon oxide film, formed by the plasma oxidation process (the method of the present invention) under the conditions C of a high oxygen concentration of approximately 23% and a high pressure of 666.5 Pa, had a small film thickness difference due to the pattern density in the pattern structure of the wafer W, compared to the silicon oxide film formed by the plasma oxidation process under the conditions A of a low oxygen concentration of approximately 1% and a low pressure of 133.3 Pa in the Ar and $O_2$ gas atmosphere or the silicon oxide film formed by the plasma oxidation process under the conditions B of a low oxygen concentration of approximately 1% and a low pressure of 133.3 Pa in the Ar, $O_2$, and $H_2$ gas atmosphere. Specifically, it was possible to improve a difference between the film thicknesses b and c (in FIG. 8) of the sparse portion of the oxide film 111 and the film thicknesses b' and c' of the dense portion of the oxide film 111. Further, a ratio (aspect ratio) of a depth to an opening width in the depression of the pattern was 2.

Figure 9:
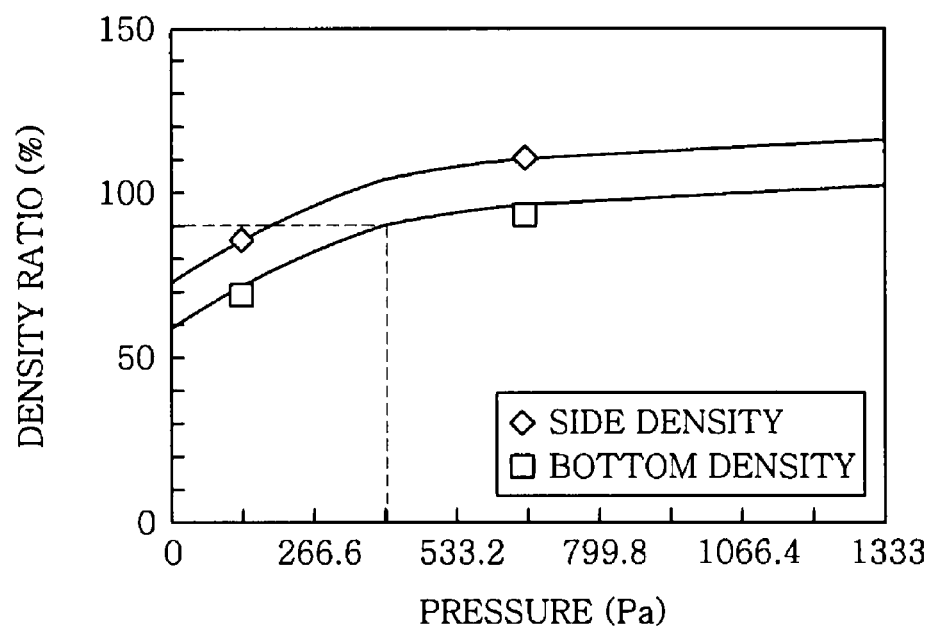
FIG. 9 is a graph illustrating a relationship between a pressure and a density ratio.
Figure 10:
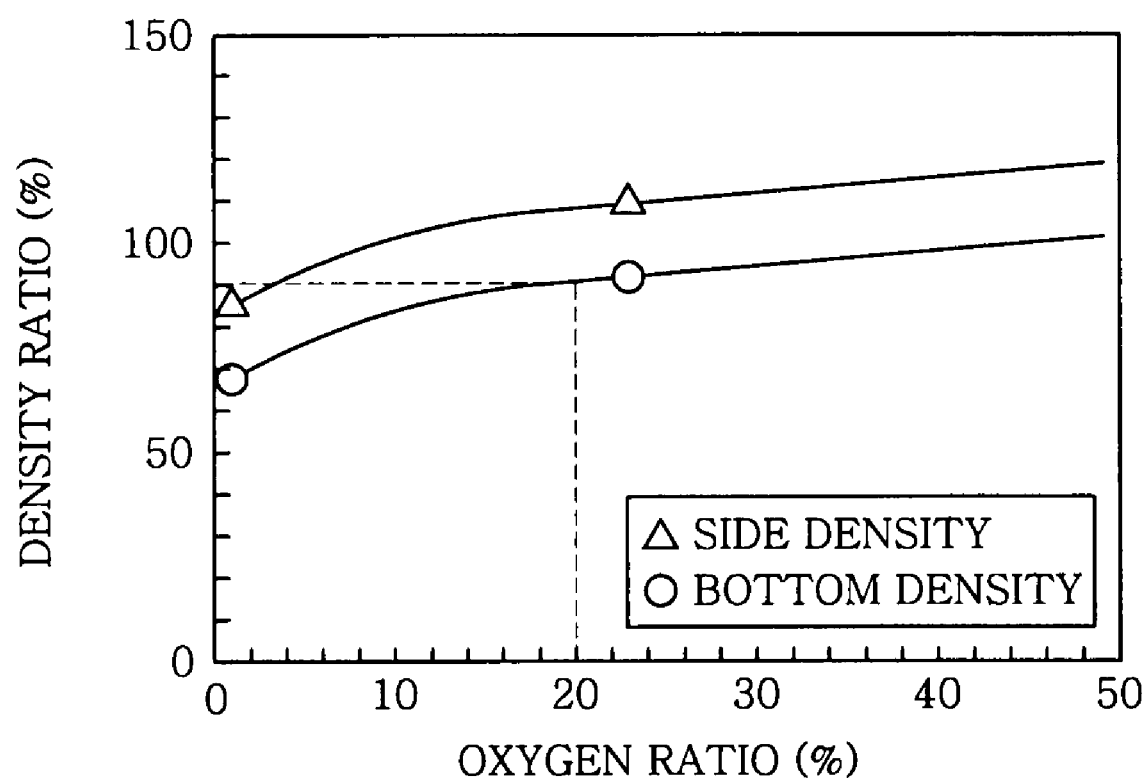
FIG. 10 is a graph illustrating a proportion of oxygen in a plasma and a density ratio.

Based on the results of Table 3, FIG. 9 illustrates a relationship between a pressure and a density ratio, and FIG. 10 illustrates a relationship between an oxygen proportion and a density ratio. Through the drawings, it was confirmed that the density ratio was 90% or more and a film thickness difference between a dense portion and a sparse portion of a silicon oxide film was reduced when the pressure was 400 Pa or more and the oxygen proportion was 20% or more.

The present invention is not limited to the above embodiment, and may be variously modified. For example, although the RLSA type plasma processing apparatus 100 is illustrated in FIG. 1, other plasma processing apparatuses, for example, a remote plasma type plasma processing apparatus, an ICP plasma type plasma processing apparatus, an ECR plasma type plasma processing apparatus, a surface reflected wave plasma type plasma processing apparatus, a magnetron plasma type plasma processing apparatus or the like, may be used.

Further, the present invention may be applied to a case in which it is necessary to form a high quality oxide film corresponding to an uneven pattern as shown in FIG. 8, for example, the formation of an oxide film within a trench in STI process or the formation of an oxide film on the sidewall of a polysilicon gate electrode of a transistor. Further, the present invention may be applied to the formation of a silicon oxide film on a silicon surface having different plane directions due to an uneven surface structure, for example, the formation of a silicon oxide film serving as a gate insulating film in a manufacturing process of a three-dimensional transistor of a fin structure or a recess gate structure. Moreover, the present invention may be applied to the formation of a gate insulating film of a transistor, or the formation of a tunnel oxide film of a flash memory. Further, the uneven structure may include holes as well as trenches.

Although the method of forming a silicon oxide film as an insulating film is described in the above embodiment, the silicon oxide film formed by the method of the present invention may be converted into a silicon oxynitride (SiON) film through a nitrification process. In this case, although no particular limitation is imposed on a nitrification method, it is preferable to perform a plasma nitrification process by using a gas mixture containing Ar gas and $N_2$ gas.

INDUSTRIAL APPLICABILITY

The present invention may be suitably applied to the formation of a silicon oxide film in the manufacture of various semiconductor devices.

What is claimed is:

1. A plasma oxidizing method comprising:
    loading an object to be processed, which has a silicon surface having a pattern of prominences and depressions, into a processing chamber of a plasma processing apparatus;
    heating the object;
    forming a plasma in the processing chamber; and
    forming a silicon oxide film by oxidizing the silicon surface of the object by using the plasma,
    wherein the object is heated to a temperature ranging from 200° C. to 800° C. when the silicon oxide film is formed,
    wherein the plasma is formed under a high pressure and high oxygen condition that a proportion of oxygen in a processing gas is 20% to 100% and a processing pressure ranges from 400 Pa to 1,333 Pa, and
    wherein the pattern of the object includes sparse and dense portions having sparse and dense prominences and depressions.

2. The plasma oxidizing method of claim 1, wherein the processing pressure ranges from 400 Pa to 667 Pa.

3. The plasma oxidizing method of claim 1, wherein the processing gas includes hydrogen in a proportion of 0.1% to 10%.

4. The plasma oxidizing method of claim 1, wherein the plasma is a microwave-excited plasma formed by exciting the processing gas by a microwave introduced into the processing chamber by a planar antenna having plural slots.

5. The plasma oxidizing method of claim 1, wherein a density ratio of the pattern is 90% or more.

* * * * *